United States Patent
Hosler et al.

(10) Patent No.: US 9,754,829 B2
(45) Date of Patent: Sep. 5, 2017

(54) SELF-ALIGNED CONDUCTIVE POLYMER PATTERN PLACEMENT ERROR COMPENSATION LAYER

(71) Applicant: GLOBALFOUNDRIES Inc., Grand Cayman (KY)

(72) Inventors: Erik R. Hosler, Cohoes, NY (US); Deniz E. Civay, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 2 days.

(21) Appl. No.: 14/939,464

(22) Filed: Nov. 12, 2015

(65) Prior Publication Data
US 2017/0140985 A1  May 18, 2017

(51) Int. Cl.
| | | |
|---|---|---|
| *H01L 21/00* | (2006.01) | |
| *H01L 21/768* | (2006.01) | |
| *H01L 23/522* | (2006.01) | |
| *H01L 23/532* | (2006.01) | |

(52) U.S. Cl.
CPC .. *H01L 21/76897* (2013.01); *H01L 21/76802* (2013.01); *H01L 21/76828* (2013.01); *H01L 21/76835* (2013.01); *H01L 21/76843* (2013.01); *H01L 23/5226* (2013.01); *H01L 23/53238* (2013.01); *H01L 23/53295* (2013.01)

(58) Field of Classification Search
CPC .............................. H01L 21/76897
See application file for complete search history.

(56) References Cited

U.S. PATENT DOCUMENTS

| | | | |
|---|---|---|---|
| 5,962,341 A | * | 10/1999 | Ito .................. H01L 21/3115 257/752 |
| 6,168,704 B1 | | 1/2001 | Brown et al. |
| 6,635,406 B1 | | 10/2003 | De Leeuw et al. |
| 2006/0003579 A1 | | 1/2006 | Sir |
| 2015/0301445 A1 | | 10/2015 | Komatsu et al. |
| 2016/0071930 A1 | | 3/2016 | Bentley et al. |

OTHER PUBLICATIONS

Office Action from related U.S. Appl. No. 14/939,251 dated Oct. 5, 2016.
Office Action from related U.S. Appl. No. 14/939,319 dated Nov. 3, 2016.
Notice of Allowance from related U.S. Appl. No. 14/939,365 dated Jan. 17, 2017.
Final Office Action from related U.S. Appl. No. 14/939,251 dated Jan. 26, 2017.

* cited by examiner

*Primary Examiner* — William Harriston
(74) *Attorney, Agent, or Firm* — Amerson Law Firm, PLLC

(57) ABSTRACT

A method includes forming a first conductive feature positioned in a first dielectric layer. A conductive polymer layer is formed above the first dielectric layer and the first conductive feature. The conductive polymer layer has a conductive path length. A second dielectric layer is formed above the first dielectric layer. A first via opening is formed in the second dielectric layer and the conductive polymer layer to expose the first conductive feature. A conductive via is formed in the first via opening. The conductive via contacts the first conductive feature and the conductive polymer layer.

18 Claims, 10 Drawing Sheets

SELF-ALIGNED CONDUCTIVE POLYMER PATTERN PLACEMENT ERROR COMPENSATION LAYER

BACKGROUND OF THE INVENTION

1. Field of the Invention

The disclosed subject matter relates generally to the fabrication of semiconductor devices and, more particularly, to forming a pattern placement error compensation layer.

2. Description of the Related Art

In modern integrated circuits, minimum feature sizes, such as the channel length of field effect transistors, have reached the deep sub-micron range, thereby steadily increasing performance of these circuits in terms of speed and/or power consumption and/or diversity of circuit functions. As the size of the individual circuit elements is significantly reduced, thereby improving, for example, the switching speed of the transistor elements, the available floor space for interconnect lines electrically connecting the individual circuit elements is also decreased. Consequently, the dimensions of these interconnect lines and the spaces between the metal lines have to be reduced to compensate for a reduced amount of available floor space and for an increased number of circuit elements provided per unit area.

One technique for patterning vias is extreme ultraviolet light lithography (EUVL). EUVL techniques employ an off-axis illumination angle (e.g., 6 degrees). The off-axis illumination requires the use of reflective masks. One consequence of the off-axis illumination angle is telecentricity and shadowing errors which manifest as a pattern shift relative to the mask. An absolute pattern shift can compromise process margins by misaligning connections. An example of such misalignment could occur between vias and underling features. Typical device layouts include an amount of overlap area between layers above and below a feature that should all connect to attempt to compensate for some degree of alignment error. However, the overlap area is compromised when pattern shift occurs, which may result in a degradation in device performance. The net shift will be different in magnitude and direction for various features printed with the same mask.

The present application is directed to various methods for forming a pattern placement error compensation layer so as to eliminate or reduce the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming a pattern placement error compensation layer. One illustrative method includes forming a first conductive feature positioned in a first dielectric layer. A conductive polymer layer is formed above the first dielectric layer and the first conductive feature. The conductive polymer layer has a conductive path length. A second dielectric layer is formed above the first dielectric layer. A first via opening is formed in the second dielectric layer and the conductive polymer layer to expose the first conductive feature. A conductive via is formed in the first via opening. The conductive via contacts the first conductive feature and the conductive polymer layer.

BRIEF DESCRIPTION OF THE DRAWINGS

The disclosure may be understood by reference to the following description taken in conjunction with the accompanying drawings, in which like reference numerals identify like elements, and in which.

Figure 1A:
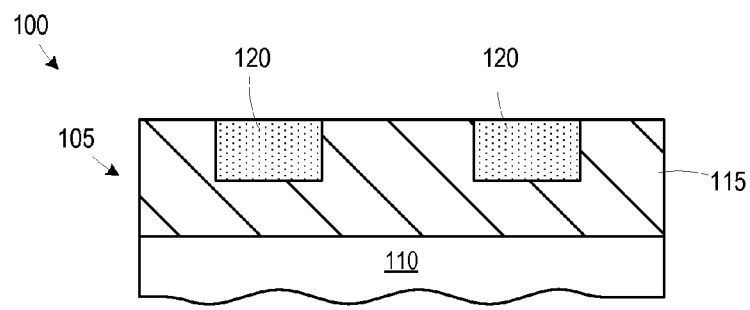
FIGS. 1A-1D are cross-section diagrams depicting illustrative techniques for forming a pattern placement error compensation layer.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. The present disclosure is directed to various methods of forming an air gap structure. With reference to the attached drawings various illustrative embodiments of the methods and devices disclosed herein will now be described in more detail.

FIGS. 1A-1D are cross-section diagrams illustrating one illustrative method for forming a pattern placement error compensation layer in a semiconductor device 100, which, in the present embodiment, may be represented by an integrated circuit including circuit elements, such as transistors, capacitors, resistors and the like. FIG. 1A illustrates the device 100 including a first metallization layer 105 formed above a substrate 110 in which semiconductor-based circuit elements, such as transistors (not shown), may be provided. Although referred to as the "first" metallization layer in this description, the metallization layer 105 is intended to be representative of any or all of the multiple metallization layers that are typically formed on an integrated circuit product as well as the device level metallization layer that is typically formed before the so-called M1 metallization layer. The first metallization layer 105 includes a first dielectric layer 115 and conductive features 120 (e.g., conductive lines or contacts) embedded therein. For convenience, any such circuit elements are not shown in FIG. 1A. The substrate 110 may also include any appropriate microstructure features, such as micromechanical components, optoelectronic components and the like, wherein at least some of these components may require an interconnect structure formed in a metallization system. In highly complex integrated circuits, a very large number of electrical connections may be required and, thus, a plurality of metallization layers may typically be formed in the metallization system. The conductive features 120 may contact underlying devices in the metallization layer 105, such as transistors (not shown).

Figure 1B:
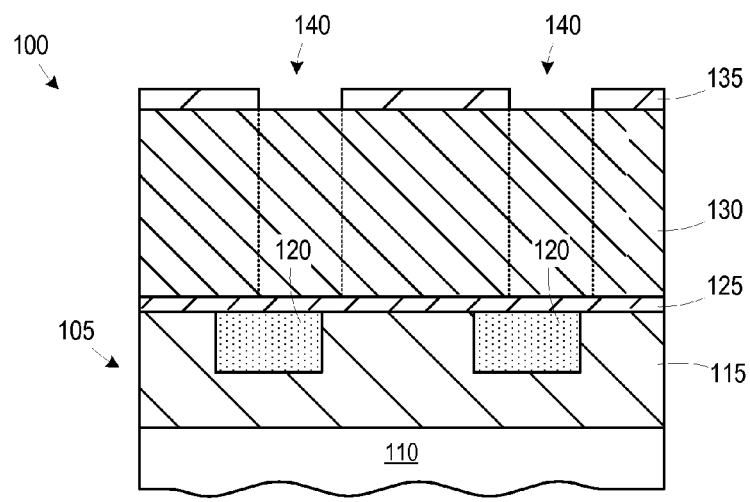

FIG. 1B illustrates the device 100 after a plurality of processes were performed. A first deposition process was performed to form a conductive polymer layer 125 above the first dielectric layer 115 and a second deposition process was performed to form a second dielectric layer 130 above the conductive polymer layer 125. A plurality of processes were performed to define a patterned mask layer 135 (e.g., a hard mask layer) having a plurality of openings 140 disposed above the respective conductive features 120. In some embodiments, the openings 140 were formed using an extreme ultraviolet light (EUVL) lithography technique. Due to pattern placement error, the openings 140 are not perfectly aligned above the conductive features 120, as simplistically depicted by the dashed line offsets. The dielectric layers 115, 130 may be the same or different materials. In the illustrated embodiment, the dielectric layers 115, 130 may be silicon dioxide, low-k dielectric materials having a dielectric constant of approximately 3.0 or lower, or ultralow-k (ULK) materials having a dielectric constant of approximately 2.5 or lower.

Various materials may be used for the conductive polymer layer 125, such as semiconducting organic polymers (e.g., polyacetylene), polystyrene-block-polydimethylsiloxane, carbon black polymer (silicon) composites, polyethylene, polyvinyl chloride, polyaniline, polythiophene, polypyrrole, polystyrene sulfonate (PEDOT), etc. The material of the conductive polymer layer 125 may be doped, blended, or formed in a matrix to add additional conductive materials. The conductive polymer layer 125 may be formed using a spin-coating process. A bake process may be performed to harden the polymers. The bake process parameters, such as time and temperature, may be controlled to affect the properties of the polymer. In general, the conductive polymer layer 125 has a characteristic conductive path length (i.e., Bjerrum length), then depends on its permittivity and temperature. The material of the conductive polymer layer 125 is selected such that its conductive path length is less than a spacing between adjacent conductive features 120 to avoid shorting the conductive features 120. The spacing between features depends on the particular technology node. For example, with a 5 nm node, the spacing may be about 16 nm. The thickness of the layers (e.g., the via layer) also scales with the technology node.

Figure 1C:
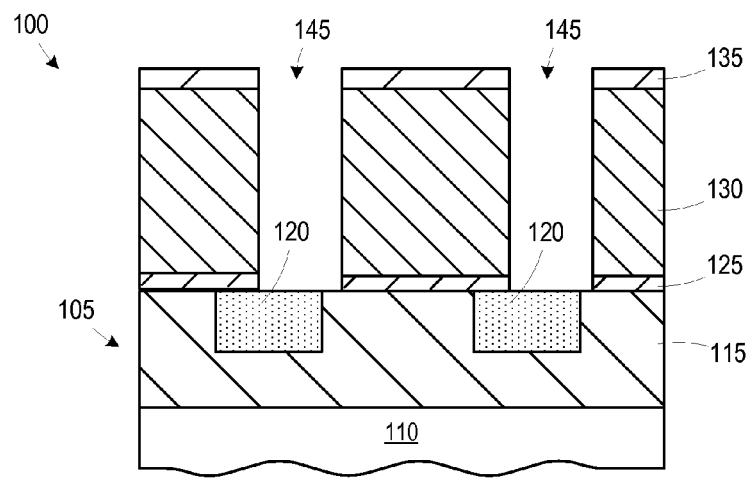

FIG. 1C illustrates the device 100 after an anisotropic etch process was performed through the patterned mask layer 135 to define via openings 145 in the dielectric layer 130 and the conductive polymer layer 125 to expose the conductive features 120. As depicted, the openings 145 are misaligned with respect to the conductive features 120.

Figure 1D:
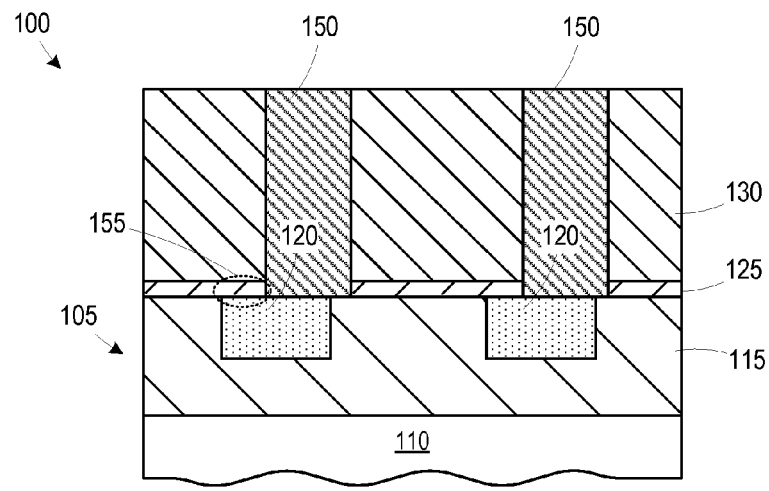

FIG. 1D illustrates the device 100 after a plurality of processes were performed to form conductive vias 150 in the via openings 145 and to remove the mask layer 135. The conductive vias 150 may include multiple layers, such as one or more barrier layers (not shown e.g., Ta, TaN, TiN, etc.) to prevent migration of any metal in the conductive vias 150 into the dielectric layer 130, a metal seed layer (e.g., copper), a metal fill material (e.g., copper), a metal silicide material, etc.

The conductive polymer layer 125 provides a path for current to flow from the conductive via 150 to the underlying conductive feature 120 in a region 155 where the conductive polymer layer 125 overlaps the conductive feature 120, thereby lowering the net contact resistance and mitigating the effects of pattern placement error on device performance. Because the conductive polymer layer 125 has a conductive path length that is less than the spacing between the conductive features 120, the conductive features 120 and vias 150 remain electrically isolated from one another.

Figure 2A:
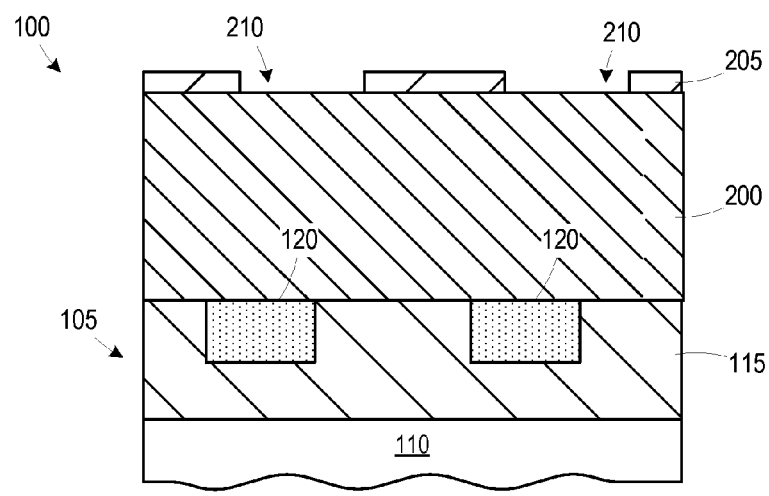
FIGS. 2A-2F are cross-section diagrams depicting illustrative techniques for forming a pattern placement compensation error using a conductive polymer layer to narrow a via opening.

FIGS. 2A-2F are cross-section diagrams depicting illustrative techniques for forming a pattern placement compensation error using a conductive polymer layer to narrow a via opening. FIG. 2A illustrates the device 100 of FIG. 1A after a plurality of processes were performed. A first deposition process was performed to form a second dielectric layer 200 above the first dielectric layer 115. A plurality of processes were performed to define a patterned mask layer 205 (e.g., a hard mask layer) having a plurality of openings 210 disposed above the respective conductive features 120. Note that the openings 210 have a width greater than a target width of the subsequently formed vias (shown below).

Figure 2B:
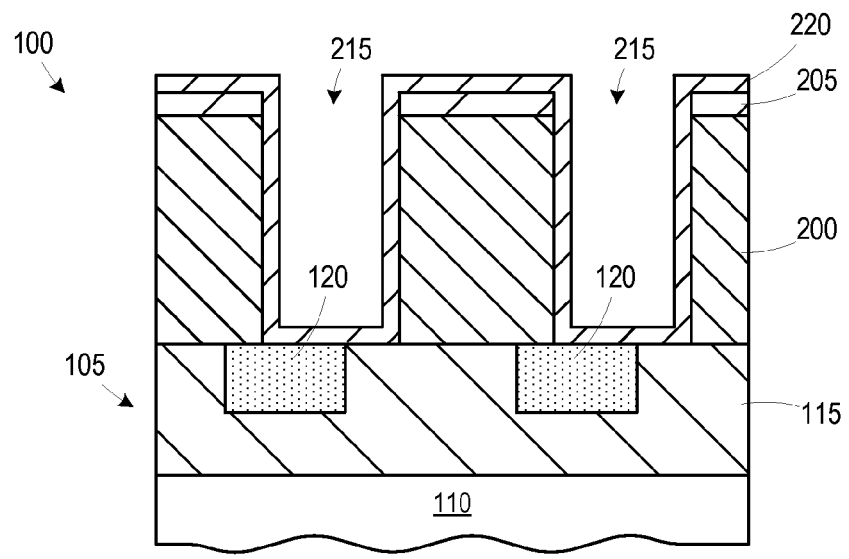

FIG. 2B illustrates the device 100 after an anisotropic etch process was performed to define increased width via openings 215 in the dielectric layer 200 to expose the conductive features 120 and after a conformal deposition process (e.g., spin coating) was performed to deposit a conformal conductive polymer layer 220 in the via openings 215. The oversizing of the openings 210 is generally larger than the feature width of the underlying conductive feature 120, but smaller than (the distance to the nearest features (e.g., other vias) plus the width of the conductive feature 120. The oversizing also depends on the conductive path length of the polymer material 220, the technology node, and the technology node overlay budget for the layers in question. In some embodiments, the oversizing may be about 10-25% greater than the width of the conductive feature 120.

Figure 2C:
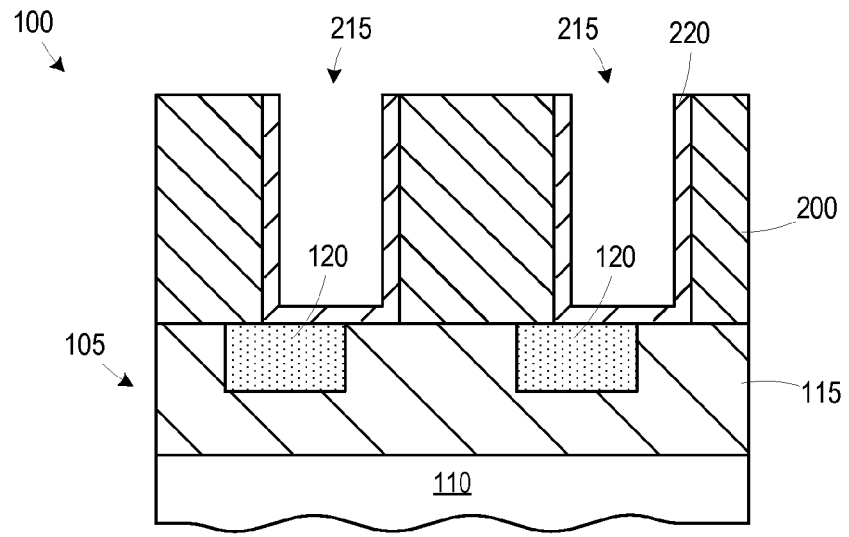

FIG. 2C illustrates the device 100 after a brush process (e.g., a rinse with a solvent such as propylene glycol monomethyl ether acetate (PGMEA)) was performed to remove portions of the conductive polymer layer 220 disposed above the mask layer 205 and an etch process was performed to remove the mask layer 205.

Figure 2D:
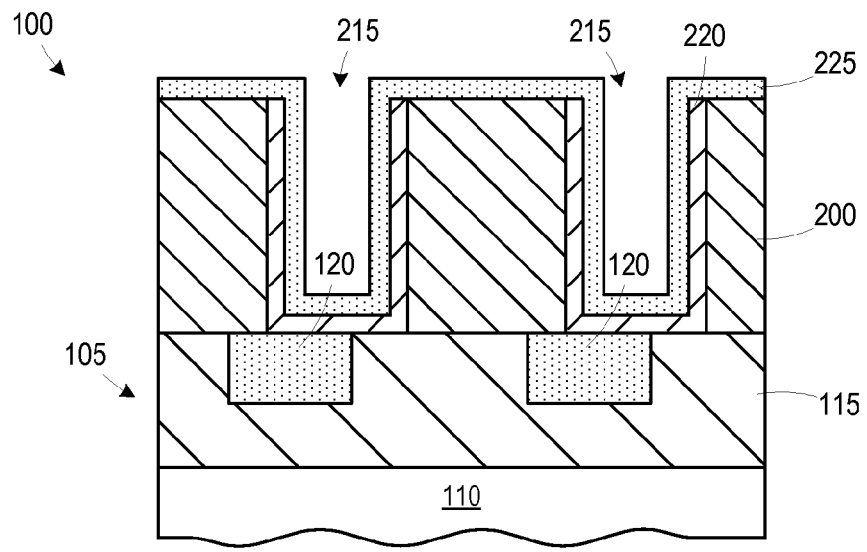

FIG. 2D illustrates the device 100 after a conformal deposition process was performed to form a third dielectric layer 225 above the second dielectric layer 200. The third dielectric layer 225 may be made of the same material as the other dielectric layers 115, 200.

Figure 2E:
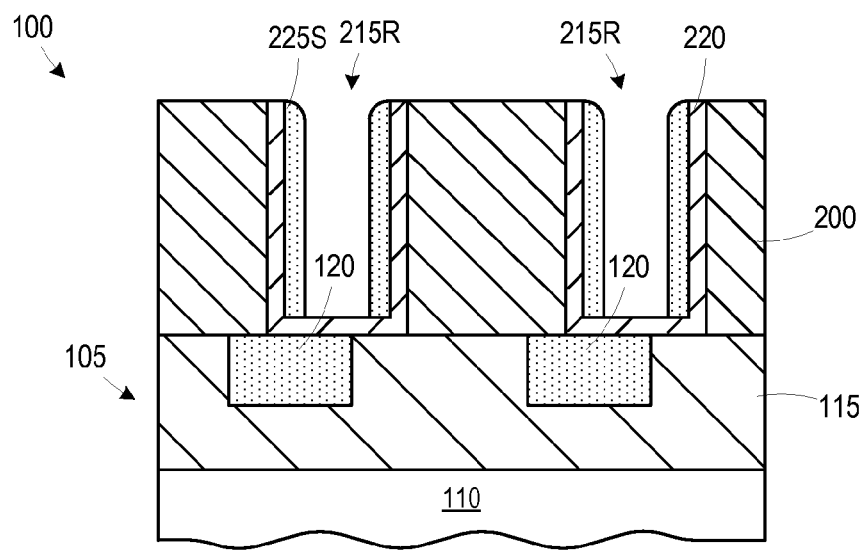

FIG. 2E illustrates the device 100 after an anisotropic etch process was performed to define a spacer 225S from the third dielectric layer 225 disposed on sidewalls of the via openings 215 to define a reduced width of the via openings 215R. The final width of the reduced width via openings 215R depends on the thicknesses of the conductive polymer layer 220 and the third dielectric layer 225.

Figure 2F:
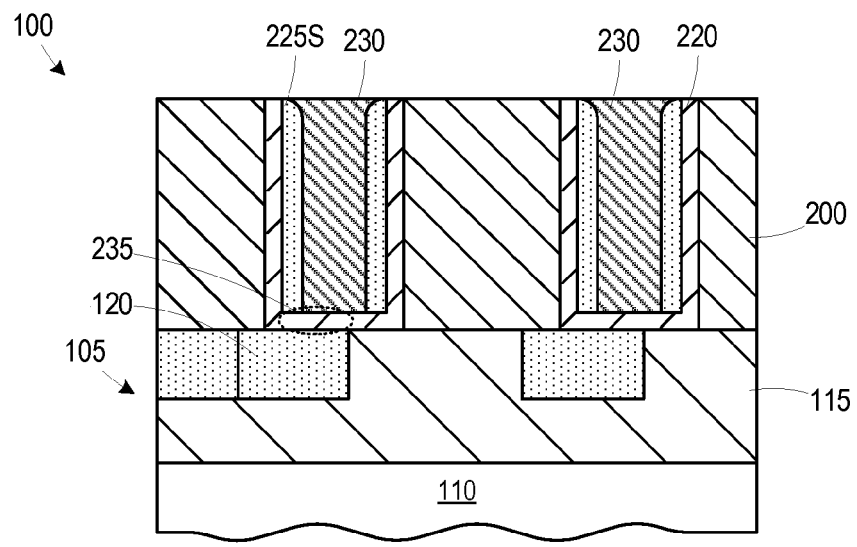

FIG. 2F illustrates the device 100 after a plurality of processes were performed to form conductive vias 230 in the via openings 215R. The conductive vias 230 may include multiple layers, such as one or more barrier layers (not shown, e.g., Ta, TaN, TiN, etc.), a metal seed layer (e.g., copper), a metal fill material (e.g., copper), a metal silicide material, etc.

The conductive polymer layer 220 provides a path for current to flow from the conductive via 230 to the underlying conductive feature 120 in a region 235 where the conductive polymer layer 220 overlaps the conductive feature 120, thereby lowering the net contact resistance and mitigating the effects of pattern placement error on device performance.

Figure 3A:
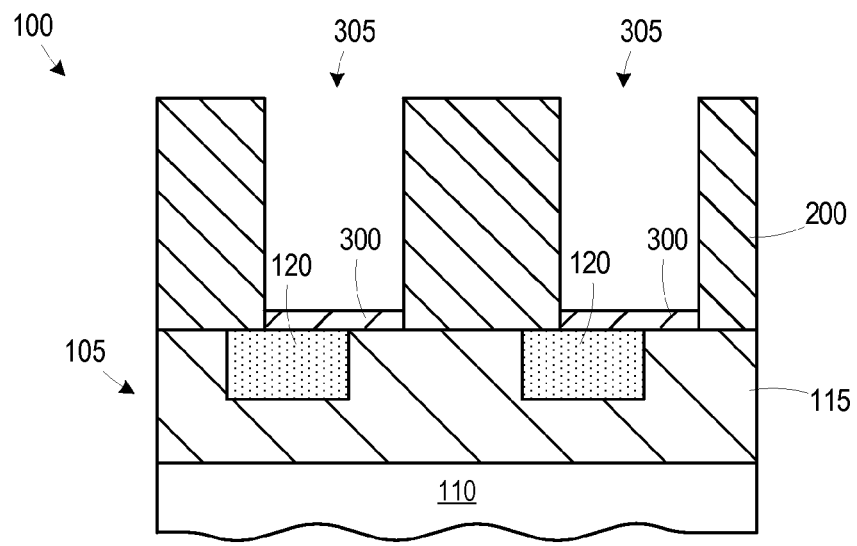
FIGS. 3A-3D are cross-section diagrams depicting illustrative techniques for forming a pattern placement compensation error using a directed self-assembly layer to narrow a via opening above a conductive polymer layer.

FIGS. 3A-3F are cross-section diagrams depicting illustrative techniques for forming a pattern placement compensation error using a directed self-assembly layer to narrow a via opening above a conductive polymer layer. FIG. 3A illustrates the device 100 of FIG. 2B after plurality of processes, including a spin coating process and a brush process, were performed to form a conductive polymer layer 300 on a bottom of via openings 305 and an etch process was performed to remove the mask layer 205.

Figure 3B:
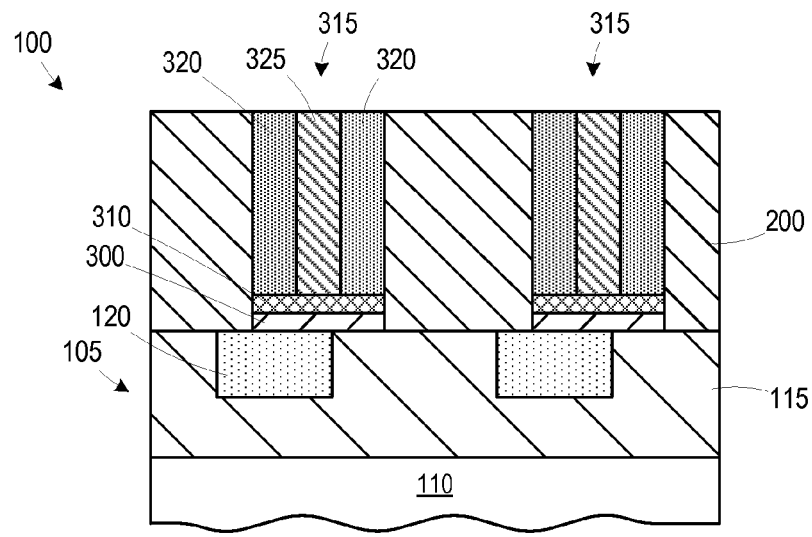

FIG. 3B illustrates the device 100 after a plurality of processes were performed to form an optional brush layer 310 above the conductive polymer layer 300 and a directed self-assembly (DSA) layer 315 in the via openings 305 above the brush layer 310. The DSA layer 315 includes an etch resistant component 320 and an etchable component 325 formed above the brush layer 310. The material of the DSA layer includes two (or more) chemical components that have controlled sizes. In accordance with techniques well known to those skilled in the art, these components are bonded together into polymer chains known as diblocks, such as A-A-A-A-A-A-A-A-A-B-B-B-B-B-B-B-B-B. The DSA material is typically applied using a spin-coating process. Immediately after coating, the A and B components are relatively disordered. In accordance with techniques well known to those skilled in the art, the A and B components are induced to separate into distinct phases and thereby form features with a characteristic pitch that is defined by the chemical composition. The DSA process is driven by thermodynamic instability. This phase separation can be promoted by any of several annealing processes, such as thermal annealing (baking), solvent annealing, or combinations thereof. The DSA material has intrinsic phase morphology and periodicity/pitch. These properties are determined by the chemical composition of the material and can be fine-tuned by changing the chemical composition. Processes for forming the DSA materials and processing the deposited material to form the ordered pattern are known to those of ordinary skill in the art, so they are not described in greater detail herein. Example DSA materials include polystyrene-block-polydimethylsiloxane, polystyrene-b-poly(methyl methacrylate), etc.

Figure 3C:
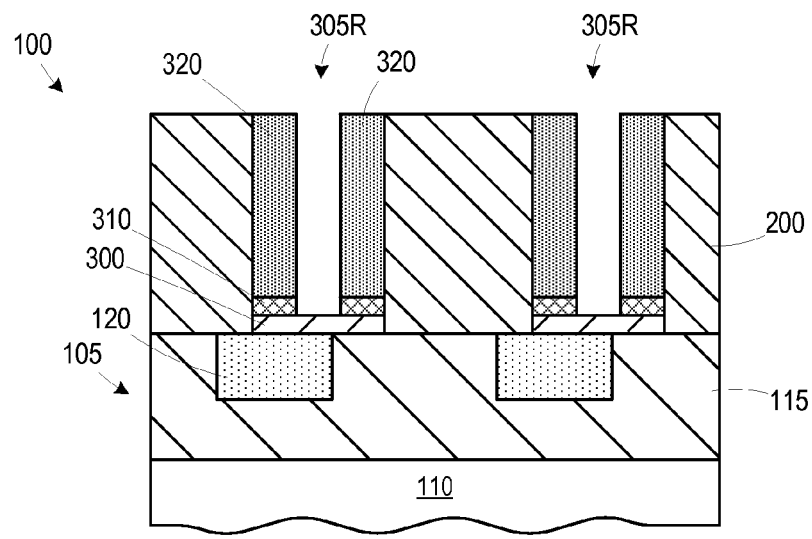

FIG. 3C illustrates the device 100 after an etch process was performed to remove the etchable components 325 of the DSA layer 315 and underlying portions of the brush layer 310 to define reduced width via openings 305R and to expose the conductive polymer layer 300.

Figure 3D:
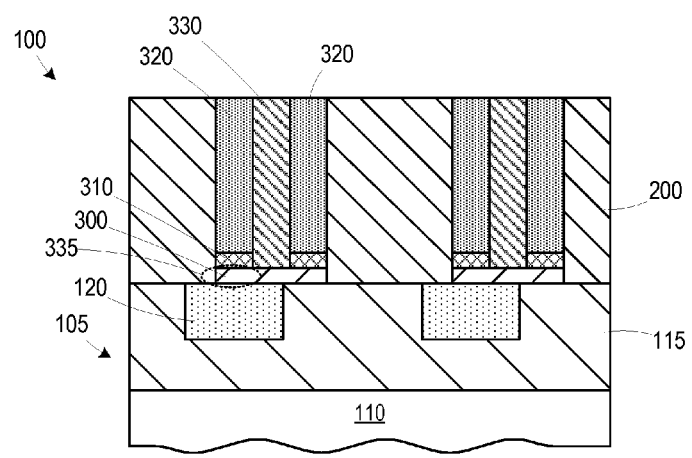

FIG. 3D illustrates the device 100 after a plurality of processes were performed to form conductive vias 330 in the via openings 305R. The conductive vias 330 may include multiple layers, such as one or more barrier layers (not shown e.g., Ta, TaN, TiN, etc.), a metal seed layer (e.g., copper), a metal fill material (e.g., copper), a metal silicide material, etc.

The conductive polymer layer 300 provides a path for current to flow from the conductive via 330 to the underlying conductive feature 120 in a region 335 where the conductive polymer layer 300 overlaps the conductive feature 120, thereby lowering the net contact resistance and mitigating the effects of pattern placement error on device performance.

FIGS. 4A-4D are cross-section diagrams depicting illustrative techniques for forming a pattern placement compensation error using a conductively doped polymer layer. The device 100 illustrated in FIG. 4A includes a polymer layer 400 formed above the first dielectric layer 115, a second dielectric layer 405 formed above the polymer layer 400, and a patterned mask layer 410 formed above the second dielectric layer 405. In some embodiments, the polymer layer 400, as initially formed, may be an insulating layer. Via openings 415 are defined in the second dielectric layer 405.

Figure 4A:
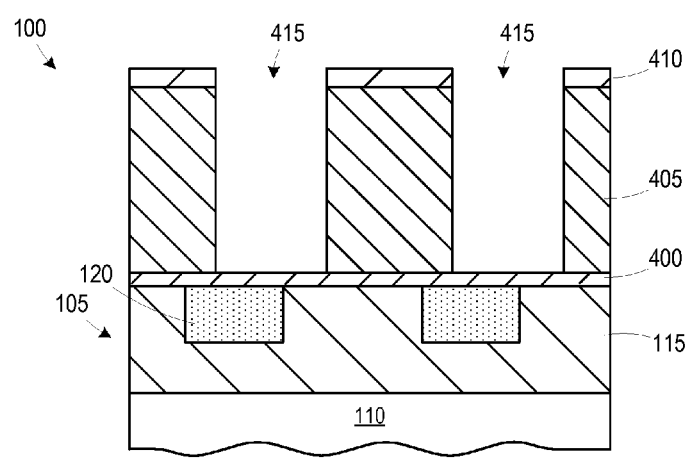
FIGS. 4A-4D are cross-section diagrams depicting illustrative techniques for forming a pattern placement compensation error using a conductively doped polymer layer.
Figure 4B:
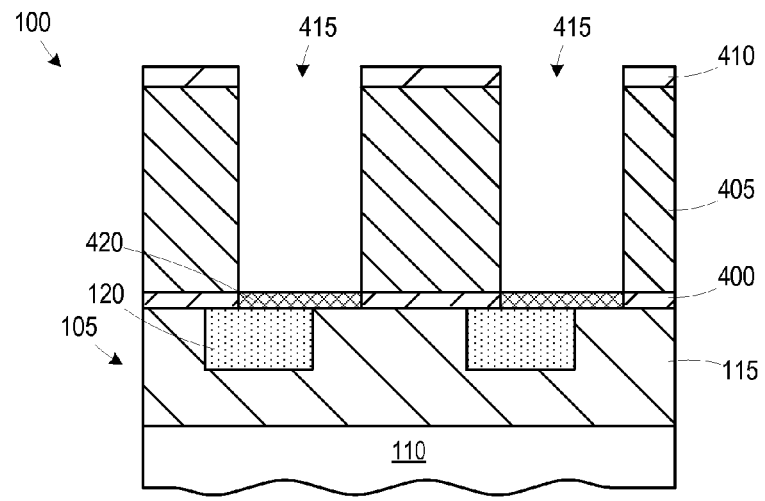

FIG. 4B illustrates the device 100 after a process (e.g., implantation or diffusion) was performed to dope the polymer layer 400 with a conductive material to define conductive polymer regions 420 in the via openings 415. Example conductive doping materials include gold nanoparticles, silver nanoparticles, phosphorus, arsenic, bismuth, germanium polydimethylsiloxane, graphene, carbon nanotubes, etc.

Figure 4C:
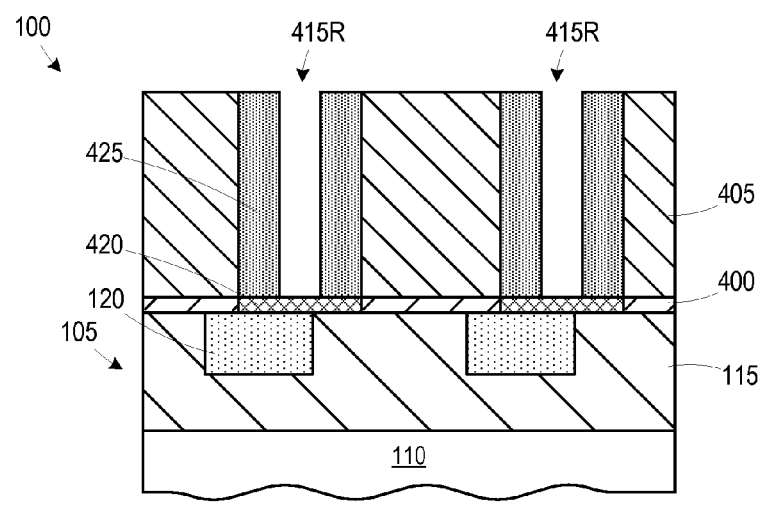

FIG. 4C illustrates the device 100 after a plurality of processes were performed to form a spacer 425 on sidewalls of the via openings 415 to define reduced width via openings 415R. The spacer 425 may be formed by conformally depositing a spacer layer and etching the spacer layer to define the spacer 425, as illustrated in FIGS. 2D and 2E. Alternatively, a DSA layer may be used to form the spacer 425, as illustrated in FIGS. 3B and 3C.

Figure 4D:
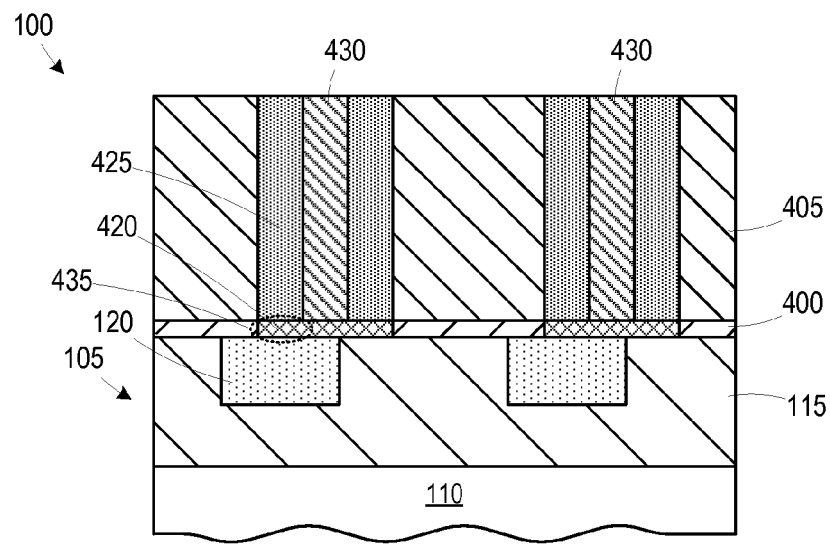

FIG. 4D illustrates the device 100 after a plurality of processes were performed to form conductive vias 430 in the via openings 415R. The conductive vias 430 may include multiple layers, such as one or more barrier layers (e.g., Ta, TaN, TiN, etc.), a metal seed layer (e.g., copper), a metal fill material (e.g., copper), a metal silicide material, etc.

The conductive polymer layer 420 provides a path for current to flow from the conductive via 430 to the underlying conductive feature 120 in a region 435 where the conductive polymer layer 420 overlaps the conductive feature 120, thereby lowering the net contact resistance and mitigating the effects of pattern placement error on device performance.

Figure 5A:
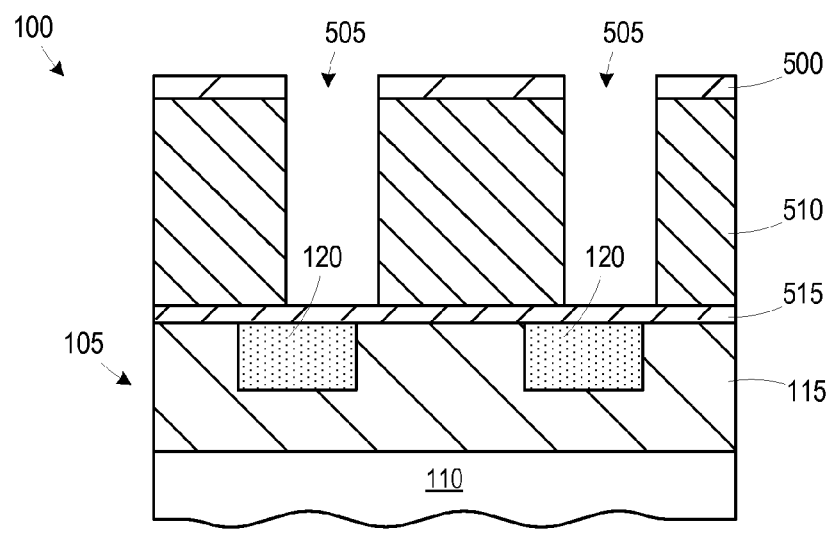
FIGS. 5A-5C are cross-section diagrams depicting illustrative techniques for forming a pattern placement compensation error using a self-aligning conductive polymer layer.
Figure 5B:
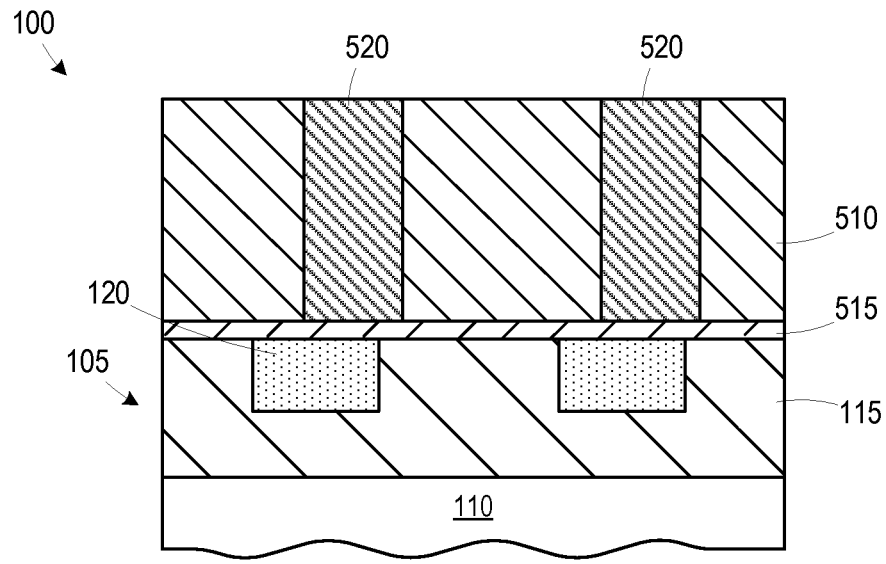
Figure 5C:
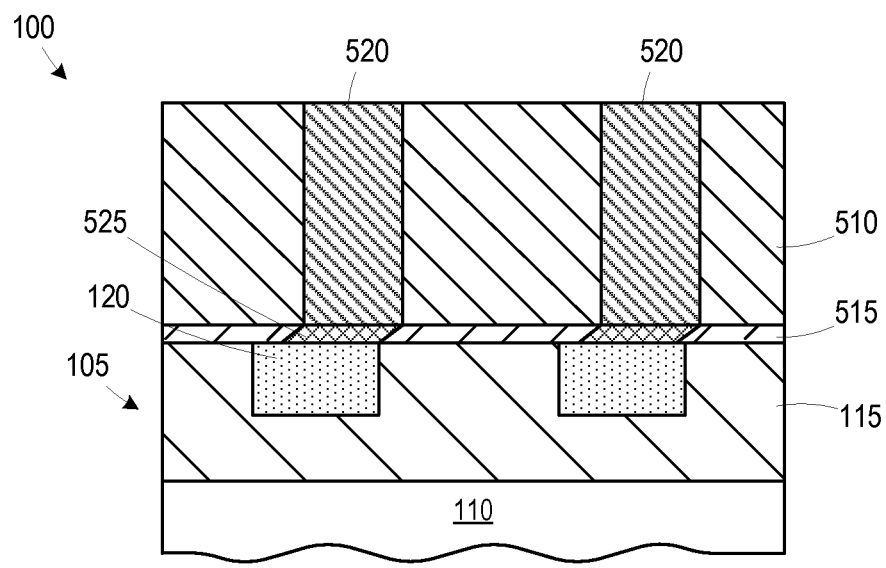

FIGS. 5A-5C are cross-section diagrams depicting illustrative techniques for forming a pattern placement compensation error using a self-aligning conductive polymer layer. FIG. 5A illustrates the device of FIG. 1B after an anisotropic etch process was performed in the presence of a patterned mask layer 500 to define via openings 505 in a dielectric layer 510 to expose a self-aligning polymer layer 515 formed above the first dielectric layer 115 and the conductive features 120. Example self-aligning polymer materials include polypyrrole in a polydimethylsiloxane matrix, polystyrene variations (cross-linkable with field antennas), ferroelectric polymers (polyvinylidene fluoride), dye doped insulating polymer mixtures, etc.

FIG. 5B illustrates the device 100 after an etch process was performed to remove the mask layer 500 and a plurality of processes were performed to form conductive vias 520 in the via openings 505. The conductive vias 520 may include multiple layers, such as one or more barrier layers (e.g., Ta, TaN, TiN, etc.), a metal seed layer (e.g., copper), a metal fill material (e.g., copper), a metal silicide material, etc.

FIG. 5C illustrates the device 100 after an electric field was established in the self-aligning polymer layer 515 by passing a current through the conductive vias 520, the self-aligning polymer layer 515, and the conductive features 120 to define conductive polymer regions 525. Prior to providing the electric current (e.g., during the formation of the self-aligning polymer layer 515 or at a further point in the process flow), the self-aligning polymer layer 515 is annealed and subsequently cooled to a temperature that allows the polymer to freely orient. For an amorphous material, the annealing may take place proximate the thermoplastic temperature of the material. For a crystalline material, the annealing may take place proximate the glass transition temperature. In one example, 120° C. and 100° C. are the thermoplastic and mobility temperatures for a specific molecular loading of polypyrrolle in a polydimethylsiloxane matrix, respectively. While maintaining the mobility temperature, the self-aligning polymer is poled by an electric field to induce alignment along the field lines between the targeted metal layers. During the timed application of current, the self-aligning polymer layer 515 aligns with the electric field, thereby becoming conductive in the regions 525 and remaining insulating elsewhere, thereby lowering the net contact resistance and mitigating the effects of pattern placement error on device performance. The establishing of the electric field may be performed at a later point in the process flow, such as after additional metallization layers have been formed. Normal operating conditions (thermal and electric current load) will act to constantly recover or maintain the polymer alignment between metal layers, maximizing the current flow through the polymer via construct.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a first conductive feature positioned in a first dielectric layer;
    forming a self-aligning polymer layer above said first dielectric layer and said first conductive feature;
    forming a second dielectric layer above said first dielectric layer;
    forming a first via opening in said second dielectric layer to expose a portion of said self-aligning polymer layer;
    forming a conductive via in said first via opening, said conductive via contacting said exposed portion of said self-aligning polymer layer; and
    applying a current through said conductive via, said self-aligning polymer layer, and said first conductive feature to form a conductive region in said self-aligning polymer layer, wherein, prior to applying said current, said self-aligning polymer layer comprises an insulating material.

2. The method of claim 1, wherein forming said first via opening comprises:
    forming a mask layer above said second dielectric layer, said mask layer including a first opening defined above said first conductive feature;
    etching said second dielectric layer in the presence of said mask layer to define said first via opening; and
    removing said mask layer.

3. The method of claim 1, further comprising forming a plurality of conductive features including said first conductive feature in said first dielectric layer, wherein a conductive path length of said conductive region is less than a spacing between adjacent conductive features.

4. The method of claim 1, further comprising annealing said self-aligning polymer layer prior to applying said current.

5. The method of claim 4, further comprising annealing said self-aligning polymer layer proximate its thermoplastic temperature prior to applying said current.

6. The method of claim 4, further comprising annealing said self-aligning polymer layer proximate its glass transition temperature prior to applying said current.

7. The method of claim 1, wherein forming said conductive via comprises forming a barrier layer and forming a conductive material above said barrier layer.

8. The method of claim 1, wherein said self-aligning polymer layer comprises at least one of polypyrrole in a polydimethylsiloxane matrix, polystyrene, a ferroelectric polymer, or a dye doped insulating polymer.

9. The method of claim 1, wherein said self-aligning polymer layer comprises polypyrrole in a polydimethylsiloxane matrix, and polystyrene, a ferroelectric polymer, or a dye doped insulating polymer, and the method further comprises annealing said self-aligning polymer at a temperature of about at least 120° C. prior to applying said current.

10. The method of claim 9, further comprising applying said current while maintaining a temperature of said self-aligning polymer layer at about 100° C.

11. A method, comprising:
    forming a first conductive feature positioned in a first dielectric layer;
    forming a self-aligning polymer layer above said first dielectric layer and said first conductive feature;
    forming a second dielectric layer above said first dielectric layer;
    forming a first via opening in said second dielectric layer to expose a portion of said self-aligning polymer layer;
    forming a conductive via in said first via opening, said conductive via contacting said exposed portion of said self-aligning polymer layer;
    annealing said self-aligning polymer layer at a first temperature; and
    applying a current through said conductive via, said self-aligning polymer layer, and said first conductive feature to form a conductive region in said self-aligning polymer layer while maintaining said self-aligning polymer layer at a second temperature less than said first temperature.

12. The method of claim 11, wherein forming said first via opening comprises:
    forming a mask layer above said second dielectric layer, said mask layer including a first opening defined above said first conductive feature;
    etching said second dielectric layer in the presence of said mask layer to define said first via opening; and
    removing said mask layer.

13. The method of claim 11, further comprising forming a plurality of conductive features including said first conductive feature in said first dielectric layer, wherein a conductive path length of said conductive region is less than a spacing between adjacent conductive features.

14. The method of claim 11, wherein, prior to applying said current, said self-aligning polymer layer comprises an insulating material.

15. The method of claim 11, wherein forming said conductive via comprises forming a barrier layer and forming a conductive material above said barrier layer.

16. The method of claim 11, wherein said self-aligning polymer layer comprises at least one of polypyrrole in a polydimethylsiloxane matrix, polystyrene, a ferroelectric polymer, or a dye doped insulating polymer.

17. The method of claim 11, wherein said second temperature comprises a mobility temperature of said self-aligning polymer layer.

18. A device, comprising:
    a conductive feature positioned in a first dielectric layer;
    a polymer layer positioned above said first dielectric layer and said conductive feature, wherein said polymer layer comprises a first insulating portion and a second conductive portion, wherein said second conductive portion contacts at least a first portion of said conductive feature, and said second conductive portion is positioned in a region where said via overlaps said conductive feature; and
    a via positioned in a second dielectric layer and contacting at least a portion of said second conductive portion.

* * * * *